(12) United States Patent
Isokawa (10) Patent No.: US 7,002,185 B2
(45) Date of Patent: Feb. 21, 2006

(54) SEMICONDUCTOR DEVICE USING SEMICONDUCTOR CHIP

(75) Inventor: Shinji Isokawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/521,301

(22) PCT Filed: Apr. 16, 2003

(86) PCT No.: PCT/JP03/04821

§ 371 (c)(1),
(2), (4) Date: Nov. 18, 2004

(87) PCT Pub. No.: WO03/098709

PCT Pub. Date: Nov. 27, 2003

(65) Prior Publication Data

US 2005/0242424 A1 Nov. 3, 2005

(30) Foreign Application Priority Data

May 21, 2002 (JP) .............................. 2002-146657

(51) Int. Cl.
*H01L 29/22* (2006.01)
*H01L 29/24* (2006.01)

(52) U.S. Cl. ............................ 257/99; 257/81; 257/82; 257/84; 257/91; 257/100

(58) Field of Classification Search ................ 257/678, 257/81, 82, 84, 91, 99, 100, 177, 179, 182, 257/689, 690, 693, 698, 699, E33.001, E33.002, 257/E33.003

See application file for complete search history.

(56) References Cited

U.S. PATENT DOCUMENTS

| 5,670,797 A * | 9/1997 | Okazaki ....................... 257/91 |
| 6,121,637 A * | 9/2000 | Isokawa et al. ................ 257/99 |
| 6,414,339 B1 * | 7/2002 | Tsutsui ......................... 257/99 |
| 6,465,808 B1 * | 10/2002 | Lin ............................. 257/81 |
| 6,835,958 B1 * | 12/2004 | Uemura ....................... 257/79 |

FOREIGN PATENT DOCUMENTS

| JP | 11-121797 | 4/1999 |
| JP | 11-168235 | 6/1999 |
| JP | 2001-36147 | 2/2001 |
| JP | 2001-223391 | 8/2001 |
| JP | 2001-298216 | 10/2001 |
| JP | 2002-94123 | 3/2002 |

* cited by examiner

*Primary Examiner*—Jasmine Clark
(74) *Attorney, Agent, or Firm*—Hamre, Schumann, Mueller & Larson P.C.

(57) ABSTRACT

A semiconductor chip 1 is provided with a first electrode 2 formed at a first corner of a crystal substrate 1a generally quadrangular as viewed in plan, and with a second electrode 3 formed to extend along two sides of the crystal substrate 1a, these sides including between them a second corner located diagonally away from the first corner. The first electrode 2 and the second electrode 3 are connected to a first lead 15 and second leads 16a, 16b formed on the circuit substrate 10 via solder paste 20. The narrow first lead 15 extends transversely to a side of the crystal substrate 1a, and the second leads 16a, 16b extends in the opposite direction to that of the first lead 15. The first lead 15 and the second lead 16b are offset from each other by an appropriate distance. With such arrangements, the surface tension of melted solder prevents the semiconductor chip 1 from being fixed to the circuit substrate 10 with a slanting posture.

15 Claims, 6 Drawing Sheets

SEMICONDUCTOR DEVICE USING SEMICONDUCTOR CHIP

TECHNICAL FIELD

The present invention relates to a semiconductor device utilizing a semiconductor chip, wherein the semiconductor chip has a surface provided with a first electrode and a second electrode, the chip being soldered to a pair of external connection electrodes formed on a surface of a circuit substrate.

BACKGROUND ART

As disclosed in prior art JP-A-H11-121797 and JP-A-2002-94123, for example, a conventional surface-mounting light-emitting diode incorporates a semiconductor chip or light-emitting diode chip (light-emitting element chip) 1, which comprises, as a light source, a gallium nitride compound semiconductor, and a crystal substrate made of sapphire glass having one surface upon which a plurality of thin semiconductor layers are formed by a known metal-organic chemical vapor deposition method. Such a thin-layer laminate, as shown in FIGS. 1(a) and 1(b), has a double hetero structure including a crystal substrate 1a, rectangular as viewed in plan and made of a transparent sapphire glass, upon which a GaN buffer layer 1b, an n-type GaN layer 1c, an InGaN activation layer 1d, a p-type AlGaN layer 1e and a p-type GaN layer 1f are stacked in this order.

At one corner (vertex portion) of the n-type GaN layer 1c mentioned above, an upper portion is removed by etching to provide a step-like configuration. In this removed portion, a p-type electrode 2 (referred to as the "first electrode" below) is formed by vapor deposition, the electrode comprising a laminate of Ti and Au layers and another laminate of Ni and Au layers stacked on the first laminate. In a portion other than the etched-away portion, the upper surface of the uppermost p-type GaN layer if is provided with a p-type electrode 3 (referred to as the "second electrode" below) comprising a laminate of Ni and Au layers and produced by vapor deposition like the above.

According to the prior art technique, a bump made of gold (Au) is formed on each of the first electrode 2 and the second electrode 3 of the light-emitting element chip 1. These bumps are fixed to a pair of external connection electrodes formed on a chip-type circuit substrate.

However, the production cost tends to be unduly high since the bumps are made of gold (Au). Another problem results from the way in which the light-emitting chip 1 (semiconductor chip) is pressed against the circuit substrate and connected to the external connection electrodes via the bumps. In this manner, the light-emitting chip is fixed to the circuit substrate, with its original posture remaining as it comes close to the substrate, so that the mounting-posture variation described below cannot be corrected.

In place of such metal bumps, it was proposed to use a thermally meltable die-bonding agent, such as solder paste, for connection. Specifically, an appropriate amount of die-bonding agent is applied to the external connection electrodes of the circuit substrate, and the semiconductor chip is placed onto the applied die-bonding agent. In this state, the die-bonding agent is heated to melt, and then caused to solidify. This method, however, gives rise to the following problems.

As noted above, the die-bonding agent applied to the external connection electrodes is heated to melt. At this time, the agent spreads in all directions over each electrode. The semiconductor chip, supported on the melted die-bonding agent, tends to deviate laterally from the prescribed center over the connection electrodes, and thereafter the chip is fixed to the electrodes at the off-center position upon solidifying of the die-bonding agent.

In this connection, it should be noted that each of the conventional external connection electrodes formed on the circuit substrate has a large surface area, and hence an unacceptably gross deviation can result.

Further, supposing that the semiconductor chip is placed on the external connection electrodes, with the right and left edges of the rectangular semiconductor chip being held in non-parallel condition (slant condition) relative to the right and left edges of the rectangular circuit substrate, the slant posture is not corrected, and therefore the fixing to the external connection electrodes is performed in the non-parallel condition.

Accordingly, when the semiconductor chip, die-bonded to the external connection electrodes of the circuit substrate, is covered by mold packaging of a synthetic resin, it is necessary to consider two cases, i.e. the off-center deviation of the semiconductor chip to be packaged and the non-parallel relationship between the edges of the chip and the edges of the circuit substrate. In either case, the mold needs to be large to ensure proper packaging, and this makes the semiconductor device unduly large and heavy.

In particular, when the semiconductor device is a chip LED comprising a light-emitting diode chip and a transparent synthetic resin modle, the off-center deviation of the semiconductor chip and the non-parallel relationship between the diode chip's edges and the circuit substrate's edges make different the emitting directions of light from diode chips, resulting in undesired variations in directivity of light.

The technical object of the present invention is to solve the above-described problems.

DISCLOSURE OF THE INVENTION

To attain the technical object, according to a first aspect of the present invention, there is provided a semiconductor device utilizing a semiconductor chip. The device comprises a semiconductor chip provided with: a first electrode formed in a small region at a first corner on one surface of a crystal substrate generally quadrangular as viewed in plan; and a second electrode formed in a large region and facing the first electrode. The second electrode is arranged to cover a second corner located diagonally away from the first corner and extend along two sides of the crystal substrate that include the second corner. The semiconductor device also comprises a circuit substrate including an upper surface provided with a pair of external connection electrodes connected to the first electrode and the second electrode via a thermally meltable die-bonding agent such as solder paste. The external connection electrodes may comprise: a first external connection electrode including a first lead connected to the first electrode; and a second external connection electrode including a second lead connected to the second electrode. The first lead of the first external connection electrode may be narrow and extend transversely to one side of the crystal substrate. The second lead of the second external connection electrode may include at least one narrow strip and extend in a direction opposite to the extending direction of the first lead. The second lead may be transverse to another side of the crystal substrate that is generally parallel to said one side to which the first lead is transverse. The first lead and the second lead may be offset from each other by a prescribed distance.

According to a second aspect of the present invention, there is provided a semiconductor device utilizing a semiconductor chip. The device may comprise a semiconductor chip provided with: a first electrode formed in a small region at a first corner on one surface of a crystal substrate generally quadrangular as viewed in plan; and a second electrode formed in a large region and facing the first electrode. The second electrode may be arranged to cover a second corner located diagonally away from the first corner and extend along two sides of the crystal substrate that include the second corner. The semiconductor device may also comprise a circuit substrate including an upper surface provided with a pair of external connection electrodes connected to the first electrode and the second electrode via a thermally meltable die-bonding agent such as solder paste. The external connection electrodes may comprise: a first external connection electrode including a first lead connected to the first electrode; and a second external connection electrode including a second lead connected to the second electrode. The first lead of the first external connection electrode may be narrow and extend transversely to one side of the crystal substrate. The second lead of the second external connection electrode may include at least one narrow strip and extend in a direction opposite to the extending direction of the first lead. The second lead may be transverse to another side of the crystal substrate that is generally parallel to said one side to which the first lead is transverse. The second lead may be provided, at an end thereof, with a front electrode piece which is connected to the second electrode and parallel to but offset by a prescribed distance from the first lead.

In the inventions according to the first and the secondaspects, thermally meltable die-bonding agent such as solder paste is applied to the first and the second external connection electrodes on the circuit substrate, and then these electrodes are aligned with the relevant one of the first electrode and the second electrode of the semiconductor chip.

In the above procedure, the first external connection electrode is to be connected to the first electrode formed in a small region at a first corner of the semiconductor chip, while the second external connection electrode is to be connected to the second electrode having a large area, the second electrode being arranged to surround the first electrode of the semiconductor chip and to cover a second corner located diagonally away from the first corner.

With this arrangement, melted die-bonding agent will spread over each external connection electrode in all directions, in particular, over the surface of the narrow lead to flow away from a side of the semiconductor chip (the crystal substrate) At the crossing point of each lead and the relevant side of the semiconductor chip, the melted die-bonding agent will flow along the relevant side of the chip. At this stage, the surface tension of the melted die-bonding agent simultaneously acts on both the lead and the crossing side of the semiconductor chip (crystal substrate). As a result, the self-alignment for automatic posture adjustment is performed so that the crossing angle between the longitudinal direction of each lead and the relevant side of the crystal substrate becomes generally 90°.

According to the first aspect of the present invention, the second lead is offset from the first lead by an appropriate distance so that the extension line of the second lead passes a point close to the areal center of the semiconductor chip as viewed inplan. Accordingly, the first lead (the first external connection electrode) overlaps the first electrode at a corner which is distant from the center of the semiconductor chip. Thus, the position at which the first lead projects from the relevant side of the semiconductor chip is farther away from the areal center of the semiconductor chip than the position at which the second lead projects from the relevant side of the semiconductor chip is. As a result, the moment due to the above-mentioned surface tension (the force that rotates the semiconductor chip about its center) becomes greater with respect to the first lead. This contributes to realizing effective automatic posture correction so that the crossing angle between the longitudinal direction of the first and second leads and the opposing sides of the crystal substrate is adjusted to become generally 90°, even when the opposing sides of the crystal substrate transverse to the longitudinal direction of the first and the second leads are non-perpendicular and non-parallel to the longitudinal direction of each lead (i.e. in slanting position).

As described above, due to the self-alignment by the surface tension of the melted die-bonding agent, the quadrangular semiconductor chip is subjected to automatic adjustment for correcting the slanting posture and for accurately positioning the chip to the center of the circuit substrate.

In this state, the melted die-bonding agent is allowed to cool for solidification, thereby fixing the semiconductor chip to the substrate with the automatically corrected posture. According to the second aspect of the present invention, the second external connection electrode is formed with at least one second lead which is narrow and extends in the direction opposite to the extending direction of the first lead, and which extends transversely to a side of the crystal substrate that is generally parallel to the side the first lead crosses. The second lead is provided, at its front end, with a front electrode piece which is connected to the second electrode and parallel to, but offset by an appropriate distance from, the first lead. Accordingly, the melted die-bonding agent spreads through the gap present between the front electrode piece and the second electrode of the semiconductor chip. At the same time, it spreads through the gap between the first lead and the first electrode. Then, the surface tension working at the front electrode piece and the surface tension working at the first lead will balance out on two sides flanking the areal center of the semiconductor chip as viewed in plan. Thus, the self-alignment by the surface tension of the melted die-bonding agent automatically corrects slanting posture of the semiconductor chip, while also automatically positioning the semiconductor chip to the center of the circuit substrate with accuracy.

According to a third aspect of the present invention, there is provided a semiconductor device utilizing a semiconductor chip, the device comprising a semiconductor chip provided with: a first electrode formed in a small region at a central portion along one side on one surface of a crystal substrate generally quadrangular as viewed in plan; and a second electrode formed in a large region and facing the first electrode, the second electrode extending along other three sides of the crystal substrate. The device also comprises a circuit substrate including an upper surface provided with a pair of external connection electrodes connected to the first electrode and the second electrode via a thermally meltable die-bonding agent such as solder paste. The external connection electrodes comprises: a first external connection electrode including a first lead connected to the first electrode; and a second external connection electrode including a second lead connected to the second electrode. The first lead of the first external connection electrode is narrow and extends transversely to one side of the crystal substrate. The second lead of the second external connection electrode includes at least one narrow strip and extends in a direction opposite to the extending direction of the first lead, the second lead being transverse to another side of the crystal substrate that is generally parallel to the above-mentioned one side to which the first lead is transverse.

According to the third aspect of the present invention, the first electrode is disposed at a generally central position along one side of the generally quadrangular crystal substrate, while the second electrode is arranged to face the first electrode and extend along the other three sides of the crystal substrate. Thus, both of the first electrode and the second electrode are laterally symmetrical on the semiconductor chip as viewed in plan. The first lead, which overlaps the first electrode, extends in the direction opposite to the extending direction of the second lead, which overlaps the second electrode. Accordingly, at the crossing portions between two opposing parallel sides of the semiconductor chip and the leads, the melted die-bonding agent spreads not only along the sides of the semiconductor chip, but also along the elongated leads. Since the surface tension of the melted die-bonding agent acts simultaneously on the respective leads and on the sides of the semiconductor chip (the crystal substrate) which are crossed by the leads, the self-alignment can be enjoyed to effectuate automatic posture correction so that the crossing angle between the longitudinal direction of each lead and the crossed side of the crystal substrate becomes generally 90°. In this way, it is possible to adjust the posture of the semiconductor chip to be mounted on the circuit substrate.

In each of the above-mentioned inventions, the second lead of the second external connection substrate may be provided, at an end thereof, with a front electrode piece which extends transversely to the longitudinal direction of the second lead and which is connected to the second electrode. With such an arrangement, the front electrode piece provides a larger electrical contact area with respect to the second electrode. Further, at this portion (the front electrode piece), the surface tension of the melted die-bonding agent contributes to the posture correction of the semiconductor chip by the self-alignment.

Further, in each invention described above, the second external connection electrode may be formed with a third lead integral therewith. The third lead extends generally in parallel to a side of the crystal substrate which is perpendicular to another side of the same substrate which is crossed by the second lead. The third lead is provided with a front end which crosses the first-mentioned side of the substrate and which is connected to the second electrode. Specifically, the third lead is L-shaped as viewed in plan, having a base end connected to the second external connection electrode and a front end which extends transversely to the longitudinal direction of the second lead to be connected to the second electrode. With such an arrangement, besides the self-alignment effect by the first and the second leads, the additional self-alignment effect can be enjoyed due to an interaction between the front end of the third lead and the side of the crystal substrate which is parallel to the longitudinal direction of the respective leads. Accordingly, the self-alignment effect is improved, whereby the posture adjustment of the semiconductor chip is more reliably performed.

Further, in each invention described above, the first lead, the second lead and the third lead may have a width which is about 0.1–0.3 times the length of the opposing sides of the crystal substrate. With such an arrangement, the melted die-bonding agent can easily spread along a side extending longitudinally of each lead, whereby the posture adjustment of the semiconductor chip by the self-alignment is much more reliably performed.

Further, in each invention described above, the semiconductor chip may be a light-emitting element, and at least the semiconductor chip may be packaged by a transparent, synthetic resin mold. With such an arrangement, it is possible to adjust the posture of the light-emitting element mounted on the circuit substrate, thereby eliminating the variations in emitting direction of light (directivity of light) from the light-emitting element. Also, the mold for packaging the semiconductor chip is made smaller than is conventionally possible. Accordingly, the semiconductor device can be reduced in size and weight.

Further, in each invention described above, a resist layer may be formed on parts of the first, second and third leads, the parts being close to a periphery of the semiconductor chip. With such a resist layer, it is possible to prevent the die-bonding agent from flowing in the longitudinal direction of the lead outwardly from the periphery of the semiconductor chip, whereby the occurrence of improper electrical connection is reliably prevented.

Further, the resist layer may be provided with a highly reflective color such as white, so that light emitted from the light-emitting element and reflected toward the upper surface of the circuit substrate is reflected by the resist layer, whereby efficient chip light-emitting diodes can be provided.

BRIEF DESCRIPTION OF THE DRAWINGS

FIG. 1(a) is a top view showing a light-emitting chip used for a first embodiment of the present invention, while FIG. 1(b) is a sectional view taken along lines Ib—Ib in FIG. 1(a).

FIG. 6(a) is a plan view showing the light-emitting diode chip placed on a circuit substrate in the first embodiment, while FIG. 6(b) is a plan view showing the light-emitting chip whose position has been adjusted due to the solidification of a die-bonding agent.

FIG. 7(a) is a plan view showing the arrangement of a resist layer in a second embodiment, while FIG. 7(b) is a plan view showing a light-emitting chip whose position has been adjusted due to the solidification of a die-bonding agent.

FIG. 8(a) is a plan view showing a light-emitting diode chip planed on a circuit substrate in a third embodiment, while FIG. 8(b) is a plan view showing the diode chip whose position has been adjusted due to the solidification of a die-bonding agent.

FIG. 9(a) is a plan view showing the arrangement of a resist layer in a fourth embodiment, while FIG. 9(b) is a plan view showing a light-emitting chip whose position has been adjusted due to the solidification of a die-bonding agent.

FIG. 10(a) is a plan view showing a light-emitting diode chip planed on a circuit substrate in a fifth embodiment, while FIG. 10(b) is a plan view showing the diode chip whose position has been adjusted due to the solidification of a die-bonding agent.

FIG. 11(*a*) is a plan view showing the arrangement of a resist layer in a sixth embodiment, while FIG. 11(*b*) is a plan view showing a light-emitting chip whose position has been adjusted due to the solidification of a die-bonding agent.

BEST MODE FOR CARRYING OUT THE INVENTION

Preferred embodiments for carrying out the present invention will be described below with reference to the drawings illustrating chip LEDs as an example of semiconductor device. FIGS. 1–6 show a first embodiment. The chip LED includes a circuit substrate 10 as an insulating substrate, a light-emitting diode chip 1 as an example of semiconductor chip mounted on the upper surface of the substrate, and a mold 19 made of a transparent synthetic resin and provided on the upper surface of the substrate 10 for entirely covering the light-emitting diode chip 1 (see FIG. 2).

Figure 1:
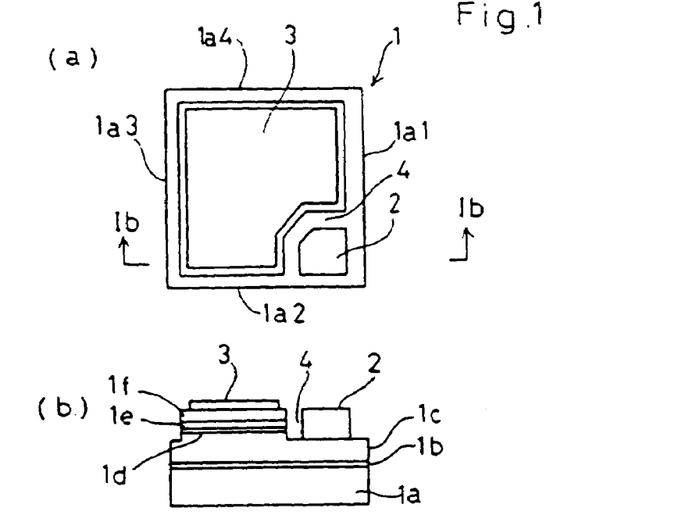

The chip mounting is performed in a manner such that a thermally meltable die-bonding agent such as solder paste is applied to a first external connection electrode 13 and a second external connection electrode 14, both formed on the insulating circuit substrate 10 which is quadrangular (including square and rectangular; the same applies hereinafter) as viewed in plan. Then, the semiconductor chip, turned upside down from the state shown in FIG. 1, is moved so that the first electrode 2 and the second electrode 3 are placed onto the corresponding parts of the applied agent, and heated. Thereafter, as the die-bonding agent solidifies, the semiconductor chip is fixed, and the electrical connection is completed (see FIG. 4).

As an example of semiconductor chip, the light-emitting diode chip (light-emitting element) 1 shown in FIGS. 1(*a*) and 1(*b*) is substantially the same in structure as the conventional one (previously described). Specifically, use is made of a crystal substrate 1*a*, which is made of transparent sapphire and formed quadrangular (including square and rectangular; the same applies hereinafter) as viewed in plan, and upon which a GaN buffer layer 1*b*, an n-type GaN layer 1*c*, an InGaN activation layer 1*d*, a p-type AlGaN layer 1*e*, and a p-type GaN layer 1*f* are stacked, providing a double hetero structure.

At one corner, an upper portion of the n-type GaN layer 1*c* is removed by etching to provide a step portion. In the removed portion, an n-side electrode or first electrode 2 is formed by vapor deposition, which consists of a laminate of Ti and Au layers and another laminate consisting of Ni and Au layers stacked on the first laminate. The remaining portion other than the etched-away portion, in other words, the upper surface of the uppermost p-type GaN layer 1*f* is provided with a second electrode 3 consisting of Ni and Au layers formed by vapor deposition, wherein the layer 1*f* extends along two edges of the crystal substrate 1*a*,the edges containing a corner which is located diagonally opposite to the above-mentioned corner where the first electrode 2 is formed. With such an arrangement, the first electrode 2, formed in a relatively small region at the first-mentioned corner, has a generally pentagonal configuration as viewed in plan, while the second electrode 3, formed in a relatively large area (region) separated from the first electrode 2 by a generally L-shaped space 4 as viewed in plan, has a generally L-shaped configuration (see FIG. 1(*a*)).

Figure 2:
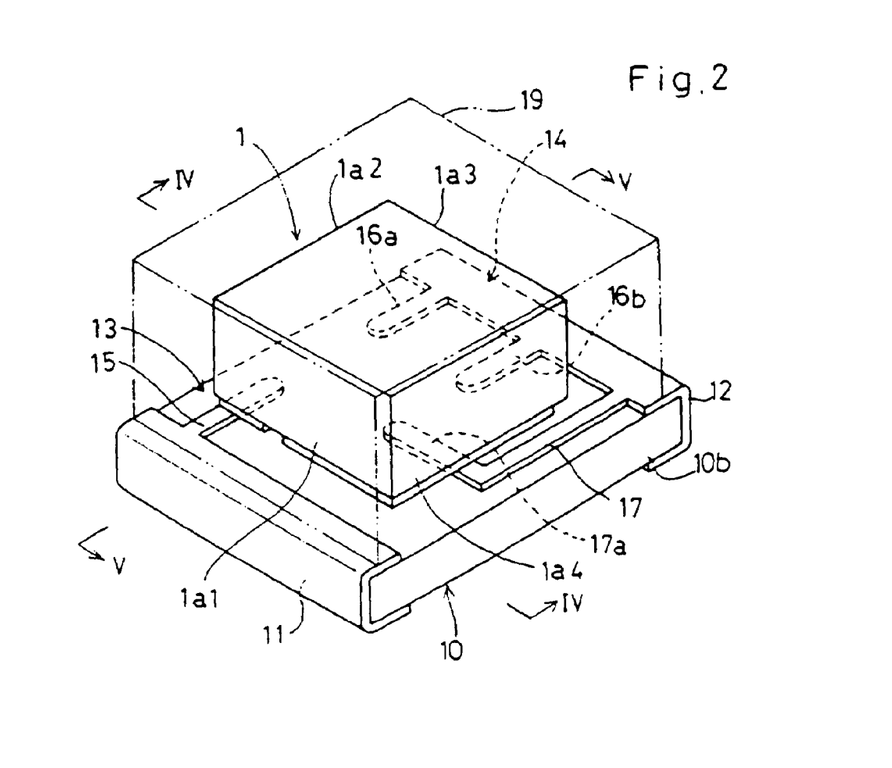
FIG. 2 is a perspective view showing a chip LED according to a first embodiment.
Figure 3:
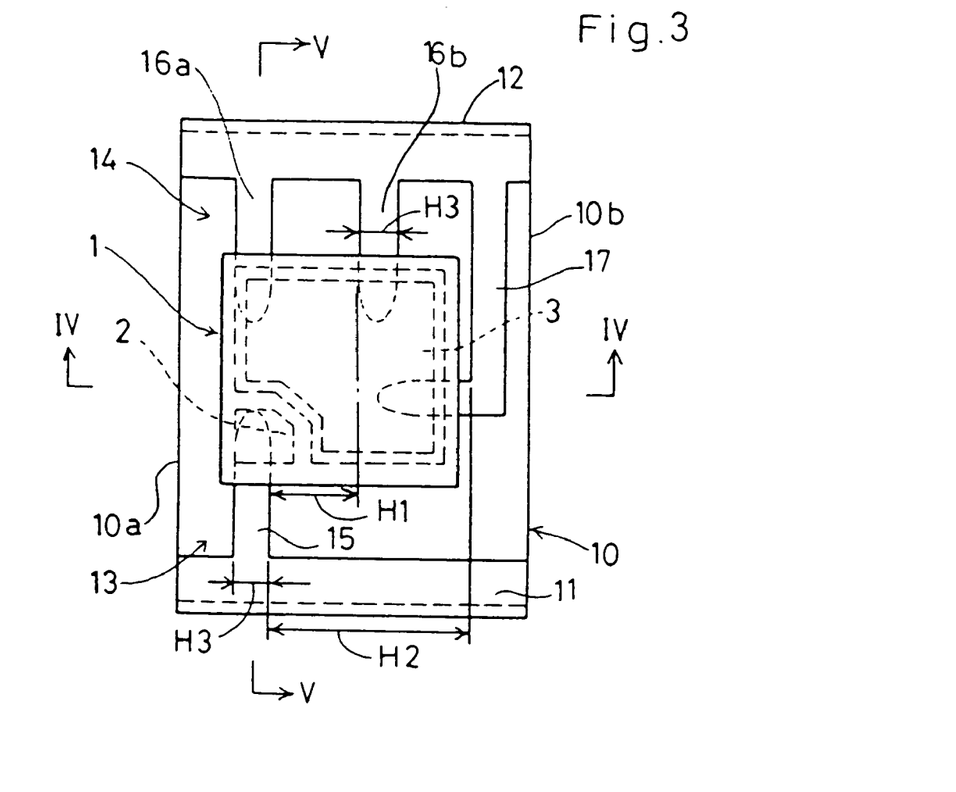
FIG. 3 is a plan view showing the chip LED of the first embodiment.
Figure 4:
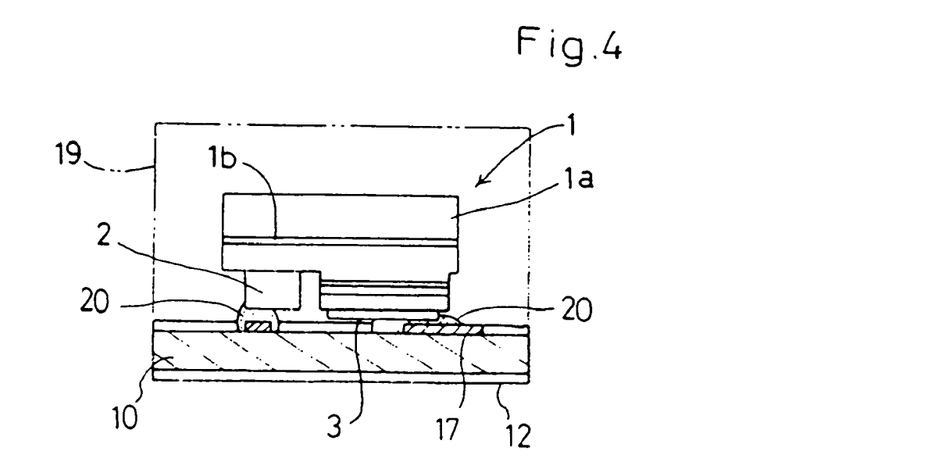
FIG. 4 is a sectional view taken along lines IV—IV in FIGS. 2 and 3.
Figure 5:
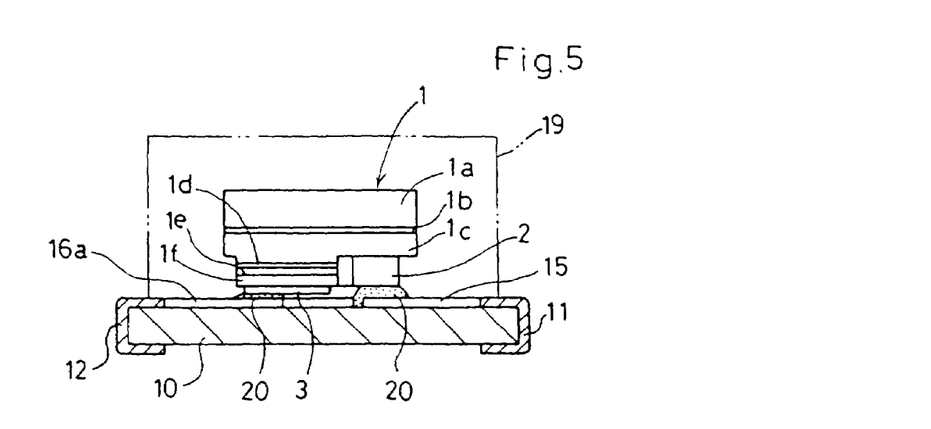
FIG. 5 is a sectional view taken along lines V—V in FIGS. 2 and 3.

The chip-type circuit substrate 10, as shown in FIGS. 2 and 3, is a generally quadrangular, insulating plate made of glass-fiber-reinforced epoxy, for example. The circuit substrate 10 has a pair of end portions opposite to each other, at which a pair of terminal electrodes 11, 12 are formed from a metal layer. Each of the terminal electrodes 11, 12 extends from the upper surface of the substrate 10 onto the lower surface via the side surface.

The circuit substrate 10 includes a surface (upper surface) for med with a first external connection electrode 13 connected to the terminal electrode 11 and a second external connection electrode 14 connected to the terminal electrode 12, these connection electrodes being formed by patterning a metal layer.

As shown in FIGS. 2 and 3, the first external connection electrode 13 includes one first lead 15 whose base end is formed integral with the terminal electrode 11. The first lead 15 is parallel to the longitudinal edges 10*a*, 10*b* of the circuit substrate 10. The front end of the first lead 15 is arranged to overlap with the first electrode 2 of the diode chip 1 as viewed in plan.

The second external connection electrode 14 includes a plurality of second leads 16*a*, 16*b* and an L-shaped third lead 17, these leads having their base ends formed integral with the second terminal electrode 12. The second leads 16*a*, 16*b* and the third lead 17 are parallel to the longitudinal edges 10*a*, 10*b* of the circuit substrate 10, wherein at least one of the second leads (in the present embodiment, the second lead 16*b*) and the third lead 17 are offset from the first lead 15 by prescribed distances H1, H2 (see FIG. 3) so that they are not in line. The front ends of the second leads 16*a*, 16*b* and the third lead 17 are arranged to overlap with the second electrode 3 of the light-emitting diode chip 1 as viewed in plan.

The first lead 15, the second leads 16*a*, 16*b* and the third lead 17 have a small width H3 which is generally 0.3–0.1 times the width of the end portions of the crystal substrate 1*a* of the light-emitting diode chip 1, and these leads are formed by patterning to be integral with the upper side portions of the terminal electrode 11 or the terminal electrode 12.

The first electrode 2 and the second electrode 3 of the diode chip 1 are overturned to face downward. Then, the first electrode 2 and the second electrode 3 are connected to the first lead 15 of the first external connection electrode 13 or the second leads 16*a*, 16*b* and the third lead 17 of the second external connection electrode 14 on the circuit substrate 10 via a thermally meltable die-bonding agent 20 such as solder paste.

Figure 6:
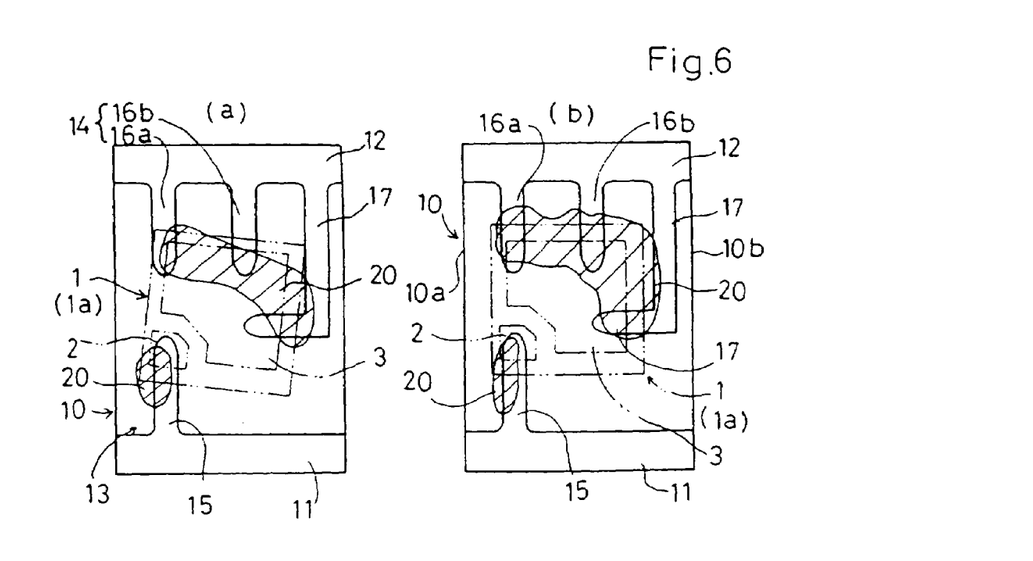

Specifically in the first embodiment, as shown in FIG. 6(*a*), the thermally meltable die-bonding agent 20 such as solder paste is applied to the hatched areas generally corresponding in position to the front ends of the first lead 15, the second leads 16*a*, 16*b* and the third lead 17. Then, the light-emitting diode chip 1 is placed on the die-bonding agent, 20 with the first electrode 2 and the second electrode 3 facing downward. In this state, the solder paste for example is heated up to a temperature no lower than its melting point, and then the die-bonding agent 20 is allowed to cool for solidification.

The light-emitting diode chip 1 is so arranged that the first electrode 2 is located on the upper side of the front end of the first lead 15, and that the second electrode 3 is located on the upper sides of the front ends of the second leads 16*a*, 16*b* and the third lead 17. When the light-emitting diode chip 1 (the crystal substrate 1*a*) is viewed in plan, as seen from FIG. 2, the crystal substrate 1*a* has four sides: a first side 1*a*1, a second side 1*b*2, a third side 1*a*3 and a fourth side 1*a*4. As shown in the plan view of FIG. 6(*a*), the first lead 15 extends to cross the first side 1a1 of the quadrangular light-emitting diode chip 1 (the crystal substrate 1a), and the second leads 16a, 16b extend to cross the third side 1a3 of the diode chip 1 (the crystal substrate 1a). On the other hand, the third lead 17 has a base part which extends in parallel to the fourth side 1a4 of the crystal substrate 1a and is located outwards of the fourth side 1a4, while the front end 17a (a part of the L-bent member) of the third lead 17 extends to cross the fourth side 1a4.

When the light-emitting diode chip 1 is mounted onto the circuit substrate in the manner described above, the diode chip 1 may be slanted so that the first side 1a1 and the fourth side 1a4 of the chip 1 are nonparallel to the edges 10a, 10b of the circuit substrate 10, as shown by the double-dot chain lines in FIG. 6(a), or the diode chip 1 may be located at a position deviating from the center of the circuit substrate 10. In such a case, the surface tension of the thermally melted solder (die-bonding agent) 20 acts simultaneously on the respective crossing portions between the leads 15, 16a, 16b, 17a and the sides 1a1, 1a2, 1a3, 1a4 of the light-emitting diode chip 1. Thus, by the self-alignment effect due to the surface tension, the quadrangular diode chip 1 undergoes automatic posture correction (see FIG. 6(b)) so that the crossing angle between the longitudinal direction of the first lead 15 and the first side 1a1 of the diode chip 1 becomes generally 90° as viewed in plan. Likewise, the crossing angle between the longitudinal direction of the second leads 16a, 16b and the third side 1a3 becomes generally 90° as viewed in plan. Further, the crossing angle between the longitudinal direction of the front end 17a of the third lead 17 and the fourth side 1a4 becomes generally 90° as viewed in plan. In the present embodiment, the first lead 15 and the second leads 16a, 16b extend in parallel to the longitudinal edge 10a (10b) of the circuit substrate 10. Accordingly, the posture adjustment is performed so that the first side 1a1 of the quadrangular diode chip 1 becomes parallel to the edge 10a of the circuit substrate 10.

Thereafter, the fixing of the diode chip 1 is performed in the posture corrected state by the solidification of the melted solder. In a preferred embodiment, it is possible not to use the third lead 17 shown in FIGS. 2–6.

In the embodiment shown in FIG. 6(a), a front portion (the position of the part bonded to the first electrode 2) of the first lead 15 and an extension line of the first lead 15 are sufficiently offset from the center of the plan view of the diode chip 1 (the crystal substrate 1a) On the other hand, an extension line of the second lead 16b and an extension line of the front end 17a of the third lead 17 come close to the center of the plan view of the light-emitting diode chip 1. Therefore, the moment resulting from the surface tension (the force causing the semiconductor chip to rotate about its central point) is greater at the side of the first lead 15. Thus, even when the two opposing sides of the crystal substrate (the first side 1a1 and the third side 1a3), which cross the extension lines of the first lead 15 and the second lead 16b, are put in nonparallel position (slant position), being non-perpendicular to the extension lines of both the leads, the automatic posture correction is executed so that the cross angle between the longitudinal direction of the first and second leads 15, 16a, 16b and the paired opposing sides (the first side 1a1 and the third side 1a3) of the crystal substrate 1a becomes generally 90°. In addition, an automatic correction is made for correctly positioning the light-emitting diode chip 1 to the areal center of the circuit substrate 10.

FIGS. 7(a) and 7(b) show a second embodiment, wherein the surfaces (upper surfaces) of the first lead 15, the second leads 16a, 16b and the third lead 17 and the surface of the circuit substrate 10 include portions close to the periphery of the diode chip 1, in other words, base-adjacent portions (close to the terminal electrode 11 or 12) of the respective leads. These portions are covered by a resist layer 21, and then, as shown by the hatching in FIG. 7(a), the die-bonding agent 20 such as solder paste is applied to areas at and near the front ends of the first lead 15, the second leads 16a, 16b and the third lead 17.

If much agent were applied to the base-adjacent portions of the leads 15, 16a, 16b and 17, the applied solder (die-bonding agent) 20 on the leads 15, 16a, 16b, 17 would be melted, and the melted solder (die-bonding agent) 20 would be drawn toward them (the base ends). As a result, the melted solder would flow away to a position where it is separated from the first electrode 2 and the second electrode 3, and this would give rise to improper electrical connection between the leads and the electrodes. However, with the resist layer 21 formed at the above-described positions, it is possible to prevent the flow of the melted solder in the longitudinal directions of the respective leads. Accordingly, the posture correcting function by the self-alignment effect is improved, and no improper electrical connection results. For the purposes of checking undesired flow of the melted die-bonding agent 20, the resist layer 21 may be applied only to the surface of each lead. Preferably, the resist layer 21 may be provided with a highly reflective color such as white, so that the light emitted from the diode chip 1 can be reflected by the resist layer 21 on the upper surface of the circuit substrate 10, which is advantageous to improving the usability of light from the diode chip.

FIG. 8(a) and FIG. 8(b) show a third embodiment, wherein the first lead 15 for the first external connection electrode 13 is the same in position and configuration as that of the first embodiment and the second embodiment. However, use is made of only one second lead 22 for the second external connection electrode 14, the first lead 15 and the second lead 22 being offset from each other by an appropriate distance H4. Further, the second lead 22 has a front end which is integrally connected to a front electrode piece 23, which may be L-shaped and extend transversely to the longitudinal direction of the base portion of the second lead 22.

As shown by the hatching in FIG. 8(a), a thermally meltable die-bonding agent 20 such as solder paste is applied to a front part of the first lead 15 and also applied to or near the second lead 22 and the front electrode piece 23. Then, the diode chip 1 is placed on the die-bonding agent 20, with the first electrode 2 and the second electrode 3 facing downward. In this state, the solder paste for example is heated to a temperature no lower than the melting point, and then the die-bonding agent 20 is allowed to cool for solidification.

In the above-described procedure, the diode chip 1 may be slanted so that the first side 1a1 and the fourth side 1a4 of the chip 1 are nonparallel to the edges 10a, 10b of the circuit substrate 10, as shown by the double-dot chain lines in FIG. 8(a), or the diode chip 1 maybe located at a position deviating from the center of the circuit substrate 10. In such a case, the surface tension of the thermally melted solder (die-bonding agent) 20 acts simultaneously on the respective crossing portions between the leads 15, 22 and the sides 1a1, 1a3 of the light-emitting diode chip 1. Thus, by the self-alignment effect due to the surface tension, the quadrangular diode chip 1 undergoes automatic posture correction (see FIG. 8(b)) so that the crossing angle between the longitudinal direction of the first lead 15 and the first side 1a1 of the diode chip 1 becomes generally 90° as viewed in plan.

Likewise, the crossing angle between the longitudinal direction of the second lead 22 and the third side 1a3 becomes generally 900 as viewed inplan. Further, in the presence of the front electrode piece 23 of the second lead 22, a proper electrical connection is made with respect to the second electrode 3.

Figure 7:
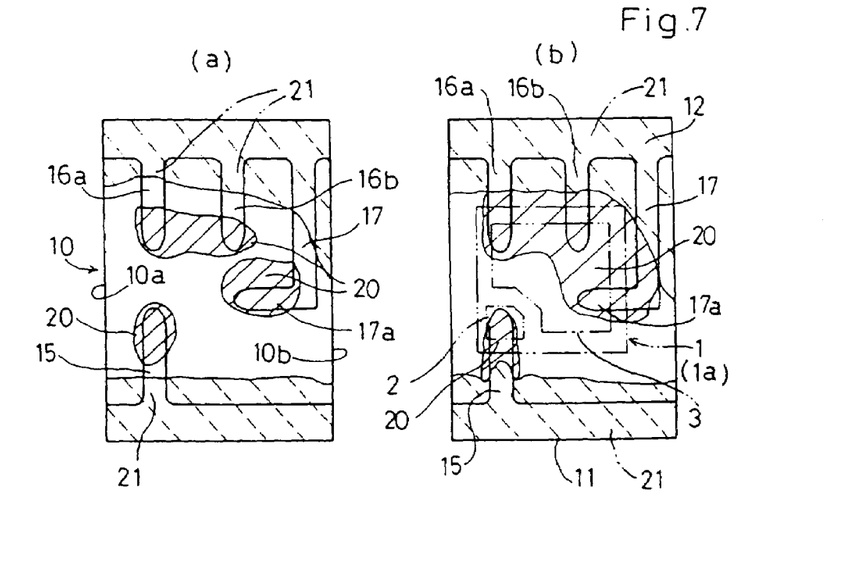
Figure 9:
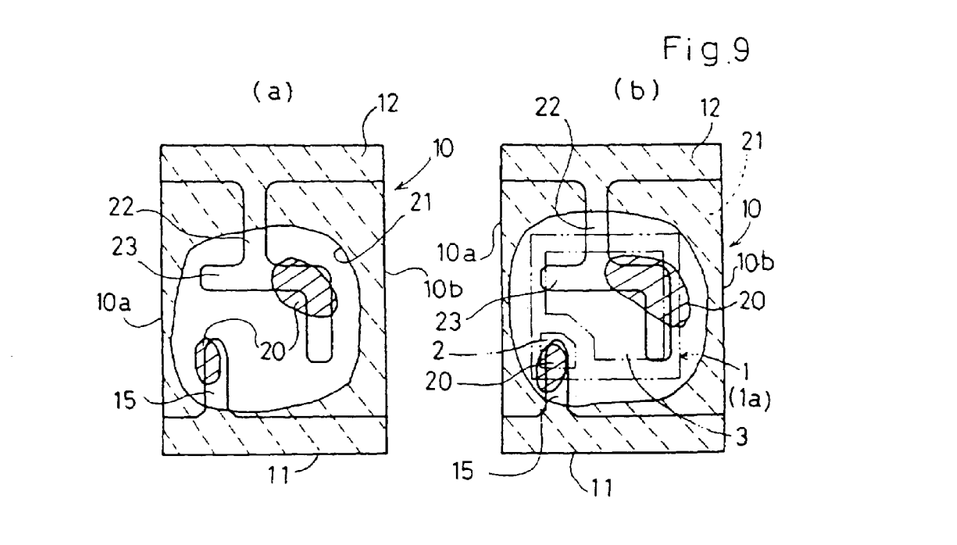

FIG. 9(*a*) and FIG. 9(*b*) show a fourth embodiment provided with the same leads as the leads 15, 22 by the third embodiment and with a resist layer 21 formed around the diode chip 1 on the circuit substrate 10, whereby the advantages of the third embodiment and the advantages of the second embodiment (see FIG. 7(*a*) and FIG. 7(*b*)) can be enjoyed.

Figure 10:
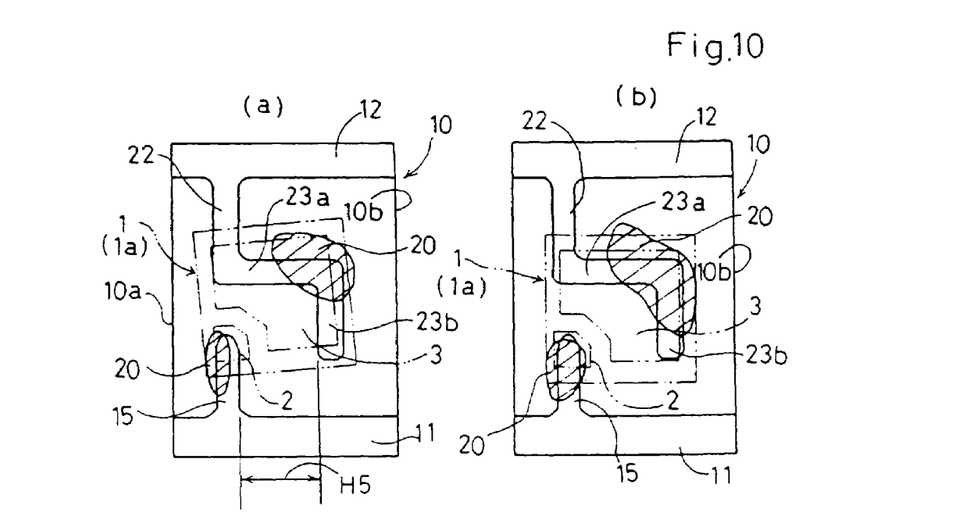

FIG. 10(*a*) and FIG. 10(*b*) show a fifth embodiment, wherein the first lead 15 of the third embodiment and the base portion of the second lead 22 are arranged in line, as viewed in plan. The second lead 22 has a front portion which integrally includes a first front electrode piece 23*a* extending generally perpendicularly to the longitudinal direction of the base portion of the second lead 22, and a second front electrode piece 23*b* extending generally perpendicularly to the first front electrode piece 23*a*, as viewed in plan, wherein the second front electrode piece 23*b* is offset from the first lead 15 by an appropriate distance H5. The first front electrode piece 23*a* and the second front electrode piece 23*b* are provided at a position allowing them to be connected (overlap) to the second electrode 3 of the diode chip 1 (the crystal substrate 1*a*).

In the above-described arrangement, as shown by the hatching in FIG. 10(*a*), the die-bonding agent 20 such as solder paste is applied to a front part of the first lead 15, the second lead 22, the first front electrode piece 23*a* and the second front electrode piece 23*b*. Then, the diode chip 1 is placed onto the die-bonding agent 20, with the first electrode 2 and the second electrode 3 facing downward. In this state, the solder paste for example is heated up to a temperature no lower than its melting point, and then the die-bonding agent 20 is allowed to cool for solidification.

Figure 8:
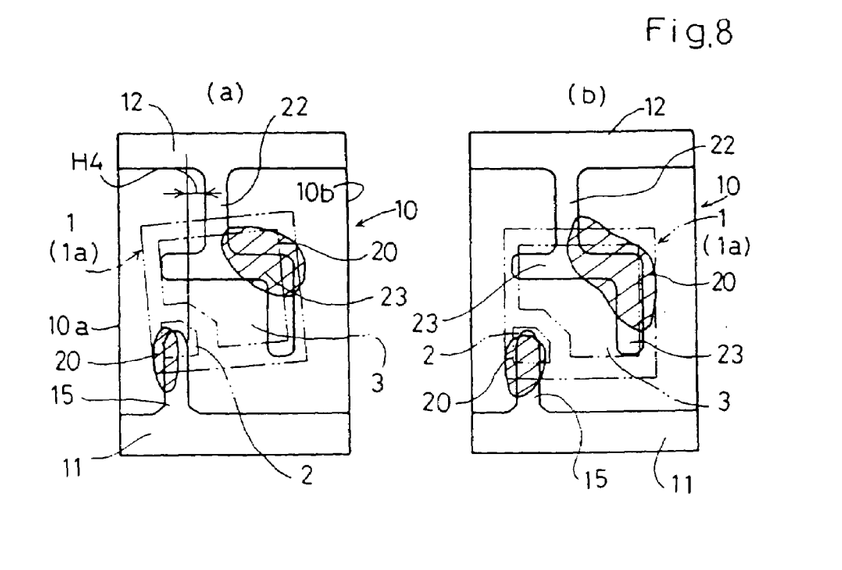

In the above-described procedure, the diode chip 1 may be slanted so that the first side 1*a*1 and the fourth side 1*a*4 of the chip 1 are nonparallel to the edges 10*a*, 10*b* of the circuit substrate 10, as shown by the double-dot chain lines in FIG. 10(*a*), or the diode chip 1 may be located at a position deviating from the center of the circuit substrate 10. In such a case, the surface tension of the thermally melted solder (die-bonding agent) 20 acts simultaneously on the respective crossing portions between the leads 15, 22 and the sides 1*a*1, 1*a*3 of the light-emitting diode chip 1, while also acting at between the surface of the front electrode pieces 23*a*, 23*b* and the surface of the second electrode. Thus, by the self-alignment effect due to the surface tension, the quadrangular diode chip 1 undergoes automatic posture correction (see FIG. 8(*b*)) so that the crossing angle between the longitudinal direction of the first lead 15 and the first side 1*a*1 of the diode chip 1 becomes generally 90° as viewed in plan. Likewise, the crossing angle between the longitudinal direction of the second lead 22 and the third side 1*a*3 becomes generally 90° as viewed in plan. Further, in the presence of the first front electrode piece 23*a* and the second front electrode piece 23*b*, a proper electrical connection is made with respect to the second electrode 3.

Figure 11:
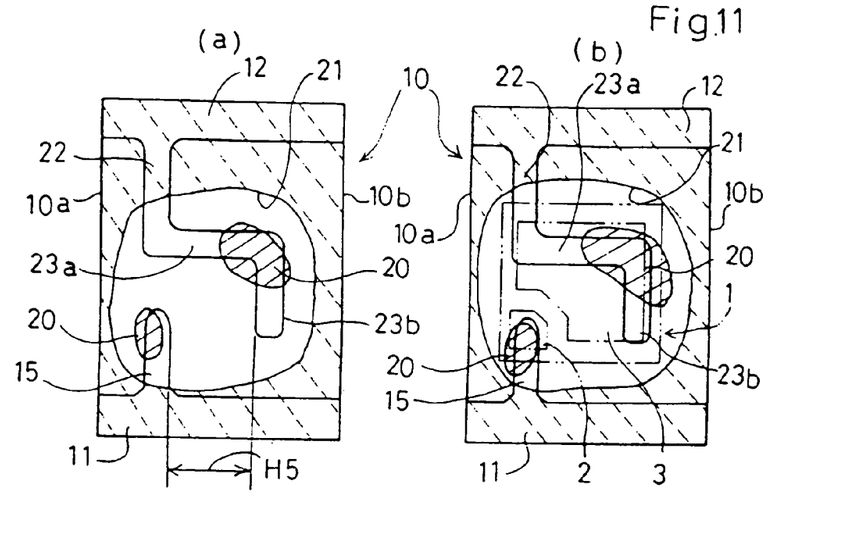

FIG. 11(*a*) and FIG. 11(*b*) show a sixth embodiment, wherein use is made of the same leads as the leads 15, 22 of the fifth embodiment and a resist layer 21 formed around the diode chip 1 on the circuit substrate 10. Thus, the advantages of the fifth embodiment and the advantages of the second embodiment (see FIG. 7(*a*) and FIG. 7(*b*)) can be enjoyed.

Figure 12:
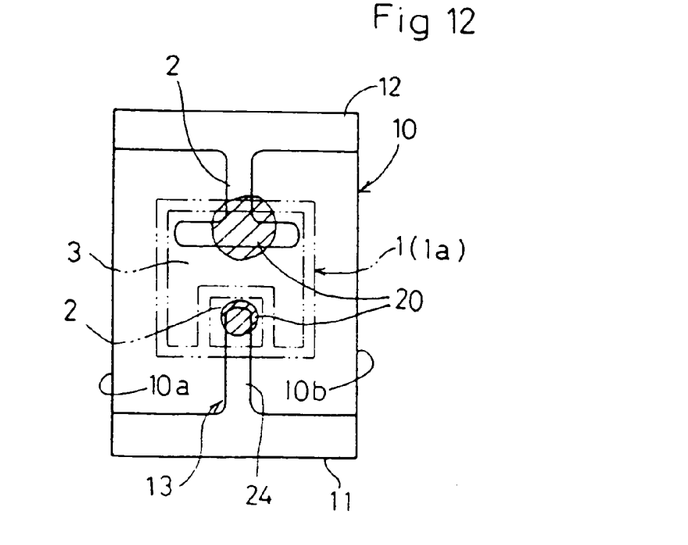
FIG. 12 is a plan view showing a light-emitting diode chip whose position has been adjusted due to the solidification of a die-bonding agent.

FIG. 12 shows a seventh embodiment, wherein the quadrangular crystal substrate 1*a* of the diode chip 1 has a surface provided with a first electrode 2, formed in a generally central, small region close to one side of the crystal substrate, and with a second electrode 3, facing the first electrode 2 and formed in a relatively large region extending along the other three sides of the substrate 1*a*, the second electrode being laterally symmetrical in FIG. 12. The upper surface of the circuit substrate 10 is provided with, as described below, a first external connection electrode 12 and a second external connection electrode 13 formed integral with the terminal electrodes 11, 12 at the respective ends of the circuit substrate 10, wherein the electrodes 12, 13 are connected to the first electrode 2 and the second electrode 3 via the die-bonding agent 20 such as solder paste.

The electrode 11 is formed integral with a narrow first lead 24 extending transversely to one side of the crystal substrate 1*a*, while the electrode 12 is formed with a second lead 25 extending in the opposite direction to the extending direction of the first lead 24 to cross another side of the crystal substrate 1*a* which is generally parallel to the above-mentioned side crossed by the first lead 24. The front end of the second lead 25 is formed integral with a front electrode piece 25*a* to be connected to the second electrode 3.

In the present embodiment, the first electrode 2 and the second electrode 3 of the diode chip 1 are laterally symmetrical, and the first lead 24 and the second lead 25 are in line. Thus, the surface tension by the melted solder acts simultaneously and with generally the same strength (generally equally) both in the extending direction of the first lead 24 and the second lead 25 and in the perpendicular direction along which the two opposing sides of the diode chip 1 (the crystal substrate 1*a*) extend. Therefore, even if the diode chip 1 is placed on the circuit substrate 10, with its sides are nonparallel to the left and right edges 10*a*, 10*b* of the circuit substrate 10, or even if the diode chip 1 is placed at a position deviating from the center of the circuit substrate 10, the self-alignment effect by the above-mentioned surface tension makes it possible to automatically correct the posture of the diode chip 1, so that each of the side surfaces of the chip is parallel or generally parallel to the corresponding side of the quadrangular circuit substrate 10. It is also possible to perform automatic correction for accurately positioning the diode chip 1 to the areal center of the circuit substrate 10.

Then, with the corrected posture, the diode chip 1 is fixed in position as the melted solder solidifies.

Regarding the above-described embodiments, the inventors conducted some experiments to discover that the automatic correction by the self-alignment resulting from the surface tension of the melted solder is reliably performed when the width of each lead is about 0.1–0.3 times the length of the sides of the diode chip 1, and this held for cases where use was made of thermally meltable die-bonding agents other than the electroconductive solder paste.

In summary, the arrangements of the above-described embodiments make it possible that the posture correction for the light-emitting diode chip 1 to be die-bonded to the circuit substrate 10 is performed due to the self-alignment effect by the die-bonding process, so that the paired side surfaces of the diode chip 1 become generally parallel to the longitudinal direction of each lead on the circuit substrate 10. As a result, the size of the mold 19 for packaging the diode chip 1 and the size of the circuit substrate 10 can be made smaller than is conventionally possible, and accordingly the resultant chip LEDs are compact and light. Further, it is possible to reduce the variations in directivity of light emitted from light-emitting diode chips 1.

The above-described embodiments relate to a chip LED utilizing a light-emitting diode chip. However, the present invention is not limited to chip LEDs, but applicable to other semiconductor devices including diodes, transistors, etc.

The invention claimed is:

1. A semiconductor device utilizing a semiconductor chip, comprising,
a semiconductor chip provided with: a first electrode formed in a small region at a first corner on one surface of a crystal substrate generally quadrangular as viewed in plan; and a second electrode formed in a large region and facing the first electrode, the second electrode being arranged to cover a second corner located diagonally away from the first corner and extend along two sides of the crystal substrate that include the second corner, and
a circuit substrate including an upper surface provided with a pair of external connection electrodes connected to the first electrode and the second electrode via a thermally meltable die-bonding agent such as solder paste,
the external connection electrodes comprising: a first external connection electrode including a first lead connected to the first electrode; and a second external connection electrode including a second lead connected to the second electrode,
the first lead of the first external connection electrode being narrow and extending transversely to one side of the crystal substrate,
the second lead of the second external connection electrode including at least one narrow strip and extending in a direction opposite to the extending direction of the first lead, the second lead being transverse to another side of the crystal substrate that is generally parallel to said one side to which the first lead is transverse, and
the first lead and the second lead being offset from each other by a prescribed distance.

2. The semiconductor device utilizing a semiconductor chip according to claim 1, wherein the second lead of the second external connection electrode is provided, at an end thereof, with a front electrode piece extending at least in a direction transverse to the longitudinal direction of the second lead and being connected to the second electrode.

3. The semiconductor device utilizing a semiconductor chip according to claim 1, wherein the second external connection electrode is formed integral with a third lead, and wherein the third lead extends generally in parallel to another side of the crystal substrate that is transverse to the side to which the second lead is transverse, the third lead including an end which is transverse to said another side and connected to the second electrode.

4. The semiconductor device utilizing a semiconductor chip according to claim 3, wherein the first lead, the second lead and the third lead have a width which is about 0.1–0.3 times a length of each of opposing sides of the crystal substrate.

5. The semiconductor device utilizing a semiconductor chip according to claim 1, wherein the semiconductor chip comprises a light-emitting element and is at least packaged by a mold made of transparent synthetic resin.

6. The semiconductor device utilizing a semiconductor chip according to claim 1, wherein a resist layer is formed on parts of the first, second and third leads, the parts being close to a periphery of the semiconductor chip.

7. A semiconductor device utilizing a semiconductor chip, comprising,
a semiconductor chip provided with: a first electrode formed in a small region at a first corner on one surface of a crystal substrate generally quadrangular as viewed in plan; and a second electrode formed in a large region and facing the first electrode, the second electrode being arranged to cover a second corner located diagonally away from the first corner and extend along two sides of the crystal substrate that include the second corner, and
a circuit substrate including an upper surface provided with a pair of external connection electrodes connected to the first electrode and the second electrode via a thermally meltable die-bonding agent such as solder paste,
the external connection electrodes comprising: a first external connection electrode including a first lead connected to the first electrode; and a second external connection electrode including a second lead connected to the second electrode,
the first lead of the first external connection electrode being narrow and extending transversely to one side of the crystal substrate,
the second lead of the second external connection electrode including at least one narrow strip and extending in a direction opposite to the extending direction of the first lead, the second lead being transverse to another side of the crystal substrate that is generally parallel to said one side to which the first lead is transverse, and
the second lead being provided, at an end thereof, with a front electrode piece which is connected to the second electrode and parallel to but offset by a prescribed distance from the first lead.

8. The semiconductor device utilizing a semiconductor chip according to claim 7, wherein the second lead of the second external connection electrode is provided, at an end thereof, with a front electrode piece extending at least in a direction transverse to the longitudinal direction of the second lead and being connected to the second electrode.

9. The semiconductor device utilizing a semiconductor chip according to claim 7, wherein the second external connection electrode is formed integral with a third lead, and wherein the third lead extends generally in parallel to another side of the crystal substrate that is transverse to the side to which the second lead is transverse, the third lead including an end which is transverse to said another side and connected to the second electrode.

10. The semiconductor device utilizing a semiconductor chip according to claim 7, wherein the semiconductor chip comprises a light-emitting element and is at least packaged by a mold made of transparent synthetic resin.

11. The semiconductor device utilizing a semiconductor chip according to claim 7, wherein a resist layer is formed on parts of the first, second and third leads, the parts being close to a periphery of the semiconductor chip.

12. A semiconductor device utilizing a semiconductor chip, comprising,
a semiconductor chip provided with: a first electrode formed in a small region at a central portion along one side on one surface of a crystal substrate generally quadrangular as viewed in plan; and a second electrode formed in a large region and facing the first electrode, the second electrode extending along other three sides of the crystal substrate,
a circuit substrate including an upper surface provided with a pair of external connection electrodes connected to the first electrode and the second electrode via a thermally meltable die-bonding agent such as solder paste, the external connection electrodes comprising: a first external connection electrode including a first lead connected to the first electrode; and a second external connection electrode including a second lead connected to the second electrode, the first lead of the first external connection electrode being narrow and extending transversely to one side of the crystal substrate, the second lead of the second external connection electrode including at least one narrow strip and extending in a direction opposite to the extending direction of the first lead, the second lead being transverse to another side of the crystal substrate that is generally parallel to said one side to which the first lead is transverse.

13. The semiconductor device utilizing a semiconductor chip according to claim 12, wherein the second lead of the second external connection electrode is provided, at an end thereof, with a front electrode piece extending at least in a direction transverse to the longitudinal direction of the second lead and being connected to the second electrode.

14. The semiconductor device utilizing a semiconductor chip according to claim 12, wherein the semiconductor chip comprises a light-emitting element and is at least packaged by a mold made of transparent synthetic resin.

15. The semiconductor device utilizing a semiconductor chip according to claim 12, wherein a resist layer is formed on parts of the first, second and third leads, the parts being close to a periphery of the semiconductor chip.

* * * * *